(12) United States Patent
Narendrnath et al.

(10) Patent No.: US 6,581,275 B2
(45) Date of Patent: Jun. 24, 2003

(54) FABRICATING AN ELECTROSTATIC CHUCK HAVING PLASMA RESISTANT GAS CONDUITS

(75) Inventors: Kadthala R. Narendrnath, San Jose, CA (US); Shamouil Shamouilian, San Jose, CA (US); Dennis S. Grimard, Ann Arbor, MI (US)

(73) Assignee: Applied Materials Inc., Santa Clara, CA (US)

( * ) Notice: Subject to any disclaimer, the term of this patent is extended or adjusted under 35 U.S.C. 154(b) by 139 days.

(21) Appl. No.: 09/767,648

(22) Filed: Jan. 22, 2001

(65) Prior Publication Data

US 2002/0095782 A1 Jul. 25, 2002

(51) Int. Cl.⁷ .................. H01R 43/00; C23C 16/00; B05C 13/00; H02N 13/00
(52) U.S. Cl. .............. 29/825; 29/831; 29/832; 29/842; 29/854; 118/500; 118/715; 118/723 R; 118/725; 118/728; 361/234
(58) Field of Search ............. 29/825, 831, 842, 29/832, 854; 361/234; 118/500, 715, 725, 728, 723

(56) References Cited

U.S. PATENT DOCUMENTS

| | | |
|---|---|---|
| 4,384,918 A | 5/1983 | Abe |
| 4,412,133 A | 10/1983 | Eckes et al. |
| 4,480,284 A | 10/1984 | Tojo et al. |
| 4,593,168 A * | 6/1986 | Amada ............. 118/50.1 |
| 4,645,218 A | 2/1987 | Ooshio et al. |
| 4,665,463 A | 5/1987 | Ward et al. |
| 4,832,781 A | 5/1989 | Mears |
| 5,055,964 A | 10/1991 | Logan et al. |
| 5,104,834 A | 4/1992 | Watanabe et al. |
| 5,117,121 A | 5/1992 | Watanabe et al. |
| 5,151,845 A | 9/1992 | Watanabe et al. |
| 5,166,856 A | 11/1992 | Liporace et al. |
| 5,191,506 A | 3/1993 | Logan et al. |
| 5,258,047 A | 11/1993 | Tokisue et al. |
| 5,275,683 A | 1/1994 | Arami et al. |
| 5,280,156 A | 1/1994 | Niori et al. |
| 5,315,473 A | 5/1994 | Collins et al. |
| 5,324,053 A | 6/1994 | Kubota et al. |

(List continued on next page.)

FOREIGN PATENT DOCUMENTS

| | | |
|---|---|---|
| EP | 635869 A1 | 4/1994 |
| EP | 439000 B1 | 9/1994 |
| EP | 791956 A | 8/1996 |
| JP | 2-27748 | 1/1990 |
| JP | 4-367247 | 12/1992 |
| JP | 6232243 | 8/1994 |
| JP | 9017850 | 1/1997 |

OTHER PUBLICATIONS

Daviet, et al., "Electrostatic Clamping Applied to Semiconductor Plasma Processing—I. Theoretical Modeling, " *J. Electrochem. Soc.*, 140(11):3245–3255 (Nov. 1993).

(List continued on next page.)

*Primary Examiner*—Allan N. Shoap
*Assistant Examiner*—Isaac N. Hamilton
(74) *Attorney, Agent, or Firm*—Ashok K. Janah; Joseph Bach

(57) ABSTRACT

A method of fabricating an electrostatic chuck capable of holding a substrate in a chamber comprises forming an at least partially sintered dielectric insert, forming a dielectric preform comprising an electrode and a gas conduit, and placing the dielectric insert in the gas conduit of the dielectric preform, and sintering the dielectric preform and the dielectric insert.

20 Claims, 5 Drawing Sheets

U.S. PATENT DOCUMENTS

| | | | |
|---|---|---|---|
| 5,325,261 A | | 6/1994 | Horwitz |
| 5,350,479 A | | 9/1994 | Collins et al. |
| 5,382,469 A | | 1/1995 | Kubota et al. |
| 5,463,526 A | | 10/1995 | Mundt |
| 5,535,090 A | * | 7/1996 | Sherman ................. 279/128 |
| 5,542,559 A | | 8/1996 | Kawakami et al. |
| 5,644,467 A | | 7/1997 | Steger et al. |
| 5,720,818 A | | 2/1998 | Donde et al. |
| 5,886,863 A | | 3/1999 | Nagasaki et al. |
| 5,904,776 A | | 5/1999 | Donde et al. |
| 5,946,183 A | * | 8/1999 | Yamada et al. ........... 279/128 |
| 6,108,189 A | | 8/2000 | Weldon et al. |
| 6,134,096 A | * | 10/2000 | Yamada et al. ........... 361/234 |

OTHER PUBLICATIONS

Daviet, et al., "Electrostatic Clamping Applied to Semiconductor Plasma Processing—II. Experimental Results," *J. Electrochem. Soc.*, 140(11):3256–3261 (Nov. 1993).

Nakasuji, et al., "Low Voltage and High Speed Operating Electrostatic Wafer Chuck," *J. Vac. Sci. Technol. A.*, 10(6):3573–3578 (Nov./Dec. 1992).

Watanabe, et al., "Effect of Additives on the Electrostatic Force of Alumina Electrostatic Chucks," *J. of the Ceramic Soc. of Jpn*, 100(1):1–6 (1992).

Watanabe, et al., "Electrostatic Force and Absorption Current of Alumina Electrostatic Chuck," *Jpn. J. Appl. Phys.*, 32(Pt. 1, No. 7):2145–2150 (1992).

Watanabe, et al., "Relationship between Electrical Resistivity and Electrostatic Force of Alumina Electrostatic Chuck," *Jpn. J. Appl. Phys.*, 32(Pt. 1, No. 2):864–871 (1993).

Watanabe, et al., "Resistivity and Microstructure of Alumina Ceramics Added with $TiO_2$ Fired in Reducing Atmosphere," *J. of the Ceramic Soc. of Jpn Int. Ed.*, 101:1076–1083.

Wright, et al., "Low Temperature Etch Chuck: Modeling and Experimental Results of Heat Transfer and Wafer Temperature," *J. Vac. Sci. Technol. A*, 10(4):1065–1070 (Jul./Aug. 1992).

U.S. patent application entitled, "Electrostatic Chuck with Polymeric Impregnation and Method of Making"; filed Jan. 12, 1995; Ser. No. 08/372, 177; Attorney Docket No. 841.

U.S. patent application entitled, "Method for Dechucking a Workpiece from an Electrostatic Chuck"; filed Jun. 7, 1995; Ser. No. 08/475,368; Attorney Docket No. 896.

U.S. patent application entitled, "Surface Preparation to Enhance the Adhesion of a Dielectric Layer"; filed Apr. 26, 1996; Ser. No. 08/639,156; Inventor: Arik Donde; Attorney Docket No. 1245.

* cited by examiner

FABRICATING AN ELECTROSTATIC CHUCK HAVING PLASMA RESISTANT GAS CONDUITS

BACKGROUND

The present invention relates to an electrostatic chuck and a method of fabricating the same.

An electrostatic chuck is used to electrostatically hold a substrate during processing, for example, to hold a silicon wafer in a chamber during semiconductor processing. The electrostatic chuck typically comprises an electrode covered by a dielectric, the electrode being electrically chargeable to form or sustain a plasma in the chamber. The plasma is an electrically conductive gaseous medium that may be formed by coupling electromagnetic energy, such as RF energy, into the chamber. For example, the plasma may be generated by inductive or capacitive coupling of energy to the gas. The electrode may also be charged by a voltage to generate an attractive electrostatic force that holds the substrate to the chuck. A heat transfer gas, such as helium, may also be provided to the backside of the substrate via holes that extend through the electrostatic chuck.

One problem with conventional electrostatic chucks arises during their use in plasma processes, especially high density plasma processes. The plasma can permeate into, or may form in, gaps and apertures in the electrostatic chuck. For example, the potential applied to the electrode may cause formation of glow discharges or electrical arcing in or about the helium gas holes passing through the electrostatic chuck. This is especially a problem when the gas holes extend through an electrode of the electrostatic chuck that is powered with a RF voltage, for example, to ignite or sustain the plasma in the chamber. The RF voltage may permeate to couple to the gas traveling through the gas holes to generate a plasma therein.

It is known to provide a dielectric insert in the gas hole to reduce plasma formation therein. The dielectric insert allows the passage of gas therethrough while reducing or preventing plasma formation therein. However, conventional methods of manufacturing the electrostatic chuck with the dielectric insert may sometimes result in cracking or fracturing about the portion of the electrostatic chuck surrounding the dielectric insert. Also, it is difficult to insert the dielectric insert into the gas hole of the electrostatic chuck without damaging the gas hole or the surrounding regions. This is especially a problem in the manufacture of electrostatic chucks made from ceramic materials which may be brittle and thereby undergo brittle fracture.

Thus, it is desirable to have an electrostatic chuck capable of reducing plasma formation about or in the electrostatic chuck, for example, in gas holes extending through the electrostatic chuck. It is also desirable to have a method of manufacturing the electrostatic chuck that allows for the robust production of electrostatic chucks. It is further desirable to allow for the efficient production of ceramic electrostatic chucks.

SUMMARY

The present invention satisfies these needs. A method of fabricating an electrostatic chuck capable of holding a substrate in a chamber is provided. The method comprises forming an at least partially sintered a dielectric insert, forming a dielectric preform comprising an electrode and a gas conduit, and placing the dielectric insert in the gas conduit of the dielectric preform, and sintering the dielectric preform and the dielectric insert.

DRAWINGS

These features, aspects, and advantages of the present invention will become better understood with regard to the following description, appended claims, and accompanying drawings which illustrate exemplary features of the invention. However, it is to be understood that each of the features can be used in the invention in general, not merely in the context of the particular drawings, and the invention includes any combination of these features, where:

DESCRIPTION

Figure 1:
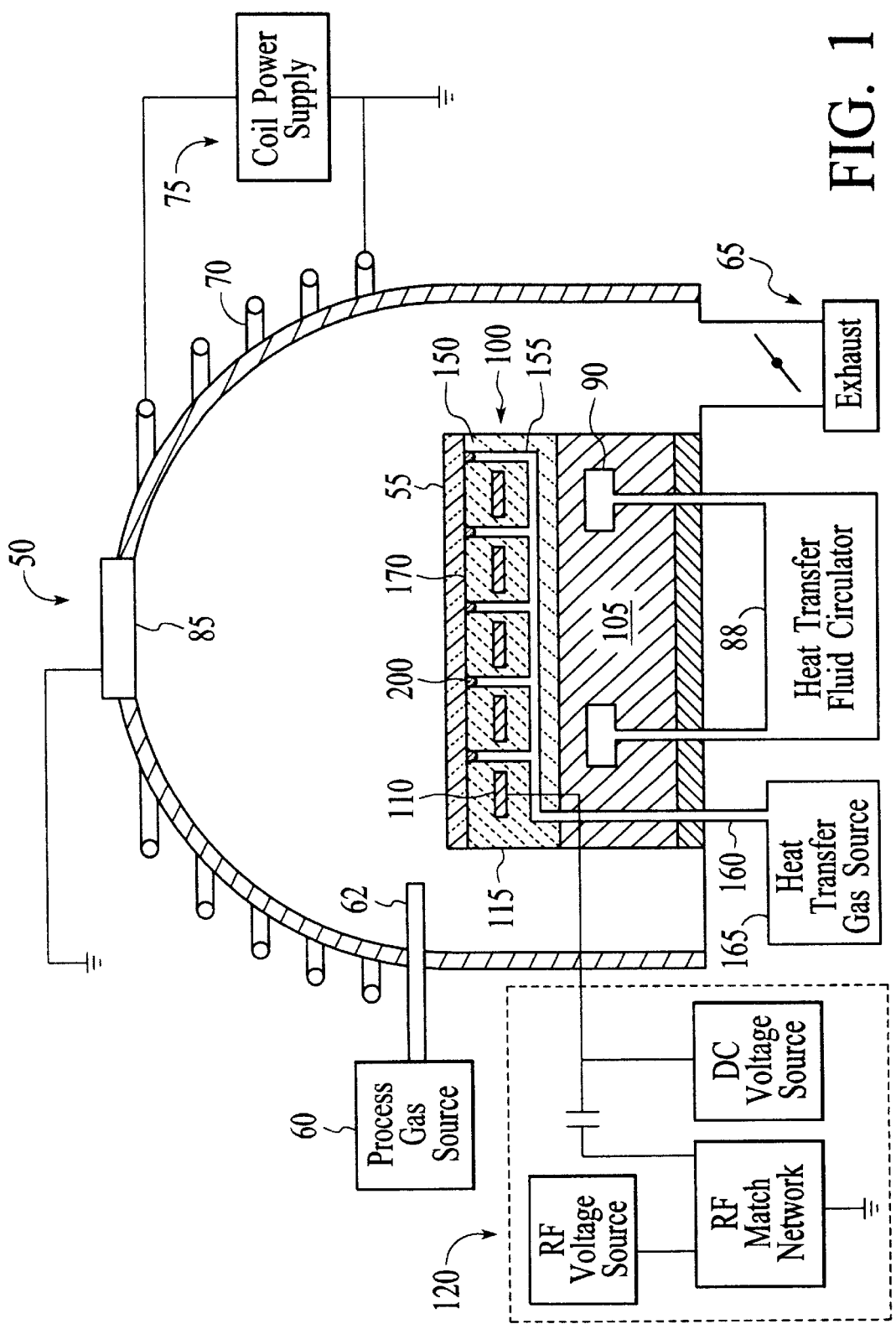
FIG. 1 is a schematic side view of a chamber comprising an embodiment of the electrostatic chuck of the present invention.

An exemplary embodiment of a substrate processing chamber 50, as illustrated in FIG. 1, schematically represents a plasma chamber commercially available from Applied Materials Inc., Santa Clara, Calif., that is suitable for plasma processing of semiconductor substrates 55; however, the present invention can also be used for other chambers or processes without deviating from the scope of the invention. Generally, the chamber 50 comprises a process gas source 60 that provides gas to a gas distributor 62 to introduce process gas into the chamber 50 and a throttled exhaust 65 for exhausting gaseous byproducts. A plasma may be formed from the gas by a plasma generator that couples RF energy into the chamber 50, such as an inductor coil 70 adjacent to the chamber 50 powered by a coil power supply 75. The chamber 50 may also include electrodes 85, 110 that capacitively couple energy into the chamber 50. The frequency of the RF voltage applied to the electrodes 85, 110 and/or the inductor coil 70 may be from about 50 KHz to about 60 MHZ, and the power level of the RF voltage/current applied to the coil or process electrodes may be from about 100 to about 2000 Watts.

An electrostatic chuck 100 is provided to hold a substrate 55 for plasma processing in the chamber 50. In one version, the electrostatic chuck 100 comprises the electrode 110 which is covered by, and more desirably embedded in, a dielectric 115 that electrically isolates the electrode 110 from the substrate 55. Optionally, a base 105 may support the electrostatic chuck, and a heat transfer fluid circulator 88 may circulate heat transfer fluid through the channels 90 in the base to transfer heat to or from the electrostatic chuck 100. In another version, shown for example in FIG. 2a, the electrostatic chuck 100 is formed by a dielectric 115 comprising a layer of dielectric material covering a metal plate that serves as the electrode 110. In the arrangement shown in FIG. 2b, the electrode comprises an electrically conductive plate 110 covered by a dielectric layer 115, the metal plate being shaped and sized to correspond to the shape and size of the substrate 55. For example, if the substrate 55 is disk shaped, a right cylindrically shaped metal plate, such as an aluminum plate may be used.

Figure 2A:
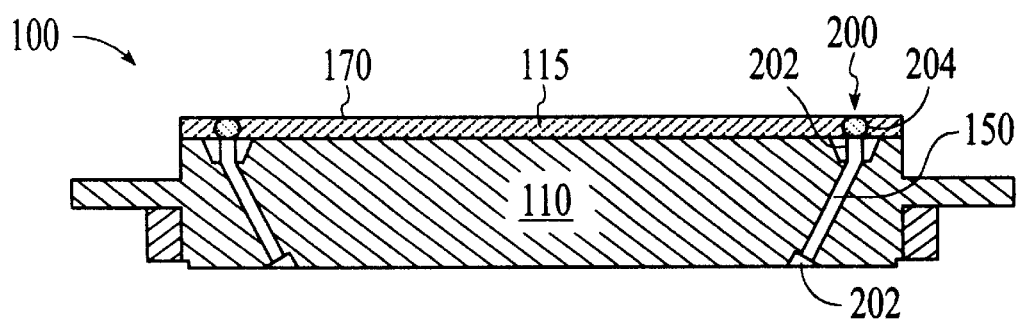
FIG. 2a is a schematic sectional side view of an electrostatic chuck comprising a dielectric covering an electrode and having gas conduits extending therethrough.
Figure 2B:
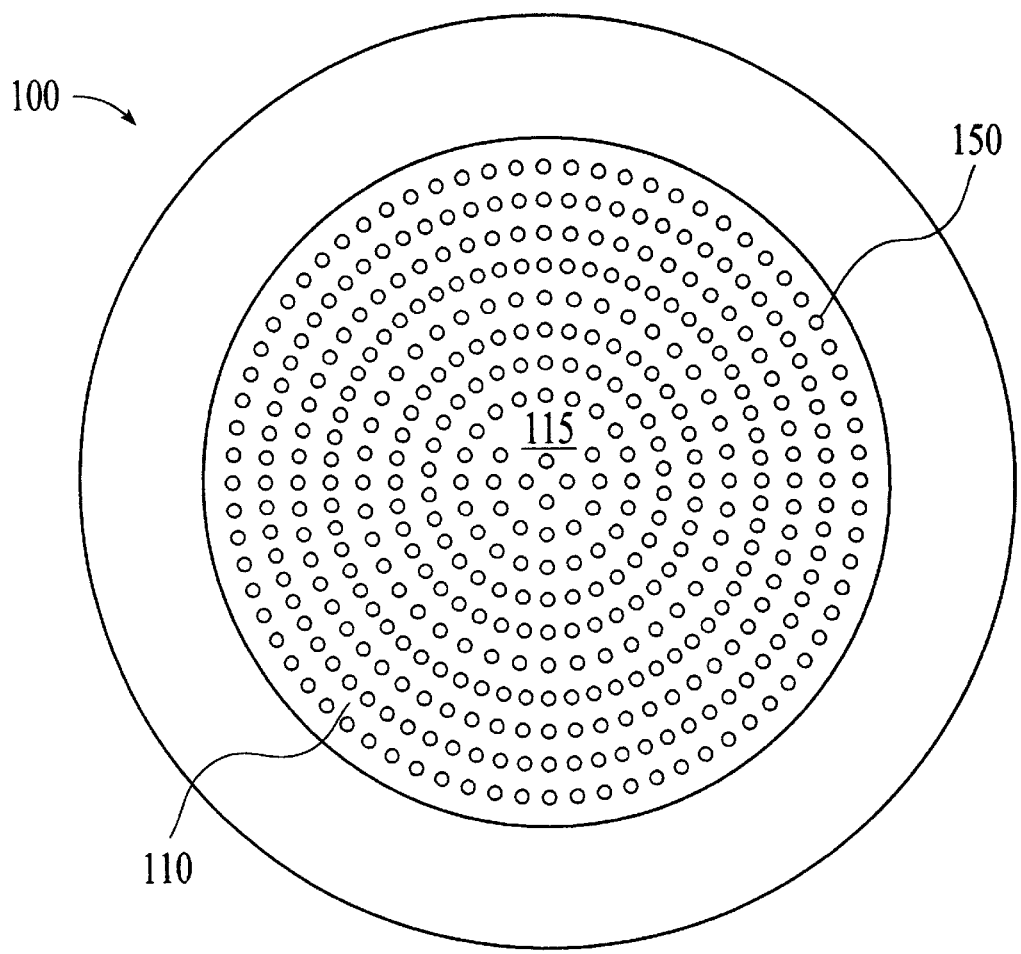
FIG. 2b is a schematic top view of the electrostatic chuck of FIG. 2a showing the outlet of the conduits.

In the embodiment shown in FIGS. 2a and 2b, the electrostatic chuck comprises a monopolar electrode 110 embedded in, or covered by, the dielectric 115. The electrode 110 comprises a metal layer composed of copper, nickel, chromium, aluminum, molybdenum, or alloys thereof. In operation, a voltage applied to the monopolar electrode 110 causes electrostatic charge to accumulate in the electrode 110 or in the dielectric 115 covering the electrode 110. The plasma in the chamber 50 provides electrically charged species of opposing polarity which accumulate in the substrate 55. The accumulated opposing electrostatic charges result in an attractive electrostatic force that electrostatically holds the substrate 55 to the electrostatic chuck 100.

Figure 3:
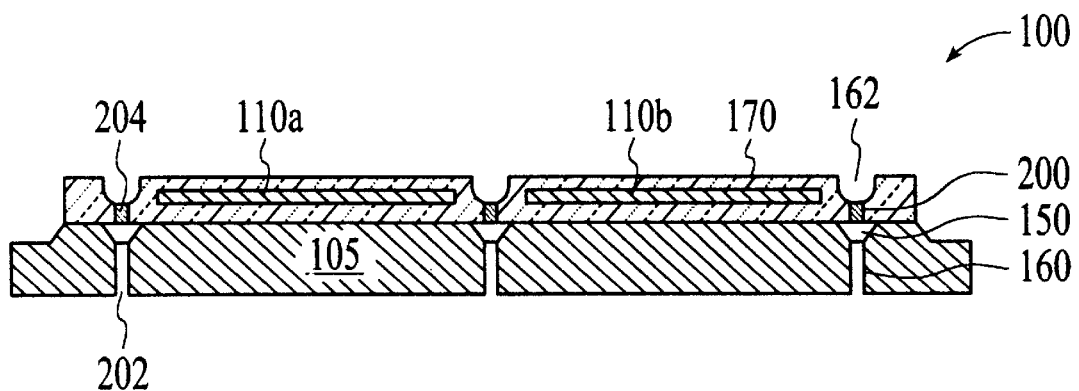
FIG. 3 is a schematic sectional side view of another version of an electrostatic chuck according to the present invention.

Alternatively, the electrode 110 may also comprise bipolar electrodes 110a, 110b, as shown in FIG. 3, that comprise at least two substantially coplanar electrodes that generate substantially equivalent electrostatic clamping forces. A differential electrical voltage may be applied to each of the bipolar electrodes 110a, 110b to maintain the electrodes at differential electric potentials to induce electrostatic charge in the substrate 55 and electrodes. The bipolar electrodes 110a, 110b may comprise two opposing semicircular electrodes 110a, 110b with an electrical isolation void therebetween that is covered by the dielectric 115. Alternative electrode configurations 110a, 110b include inner and outer rings of electrodes, polyhedra patterned electrodes, or other segmented electrode forms embedded in the dielectric 115.

One or more heat transfer gas conduits 150 extend through the electrostatic chuck 100, for example by extending through one or more of the base 105, electrode 110, and dielectric 115, as shown in FIGS. 1 through 3. In one version, the diameter of the conduits is less than about 0.5 mm, and may be even less than about 0.25 mm. A gas supply channel 155 supplies heat transfer gas to the conduits 150 via a gas supply tube 160 connected to a heat transfer gas source 165. A typical gas conduit 150 comprises at least one inlet 202 for receiving gas from a gas channel 155, and at least one outlet 204 for delivering the gas to a top surface 170 of the dielectric 115 on the electrostatic chuck 100. The gas provided to the top surface 170 of the electrostatic chuck 100 may be used to regulate the temperature of the substrate 55 by transferring heat to or from the substrate 55. In an electrostatic chuck 100 used with a 200 mm (8 inch) silicon wafer, a desirable number of outlets 204 for the gas conduits 150 may range from about 1 to about 200, and the outlets may be positioned in a ring-shaped configuration around the perimeter of the electrostatic chuck 100.

The substrate 55 held on the electrostatic chuck 100 covers and seals the edges of the dielectric 115 to reduce leakage of heat transfer gas from the peripheral edge of the electrostatic chuck 100. The dielectric 115 can also comprise grooves 162 that are sized and distributed to hold heat transfer gas such that substantially the entire surface of the substrate 55 is uniformly heated or cooled, such as for example a pattern of intersecting channels that cut through the dielectric 115. Desirably, at least one conduit 150 terminates in a groove 162, and more desirably, the conduits 150 terminate at one or more intersections of the grooves 162. Alternative groove patterns are described in, for example, U.S. patent application Ser. No. 08/189,562, entitled "Electrostatic chuck" by Shamouilian, et al., filed on Jan. 31, 1994, which is incorporated herein by reference in its entirety. Typically, the heat transfer gas comprises helium or argon.

Referring to FIGS. 2a and 3, dielectric inserts 200 are located in the outlets 204 of the gas conduits 150 to reduce or prevent plasma formation from the gas provided by the conduits 150. This version of the electrostatic chuck 100 is useful for holding substrates in high density plasma environments. High density plasmas typically contain a higher ion density of charged plasma species in thin plasma sheaths and/or plasma ions having ion energies in excess of 1,000 eV. The dielectric inserts 200 reduce or altogether prevent formation of a plasma about or in the conduit 150.

The dielectric insert 200 may also comprise a plasma-deactivating material is capable of deactivating, and consequently preventing, formation of a plasma adjacent to the gas conduits 150 below the substrate 55. The plasma-deactivating material may comprise a porous or high surface area material that prevents plasma formation by limiting the kinetic energy and/or dissipating the electrical charge of gaseous species that may become ionized in the conduits.

Illustrative methods of fabricating the electrostatic chuck will now be described. However, the present invention should not be limited to the illustrative methods of fabrication described herein. Also, it should be understood that each of the individual components, layers, and structures described herein, for example, the dielectric or dielectric insert, may be used in different combinations, and the steps of fabricating the electrostatic chuck may be conducted in a different order than that presented, as would be apparent to those of ordinary skill in the art.

Figure 5:
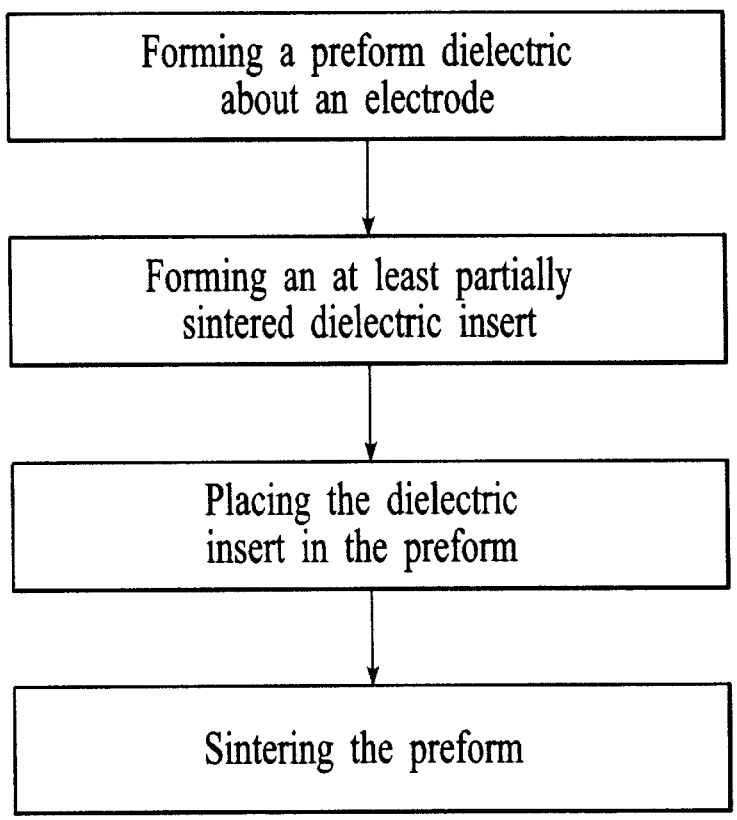
FIG. 5 is a flowchart illustrating the steps in the method of fabricating the electrostatic chuck of FIGS. 4a to 4d.
Figure 4A:
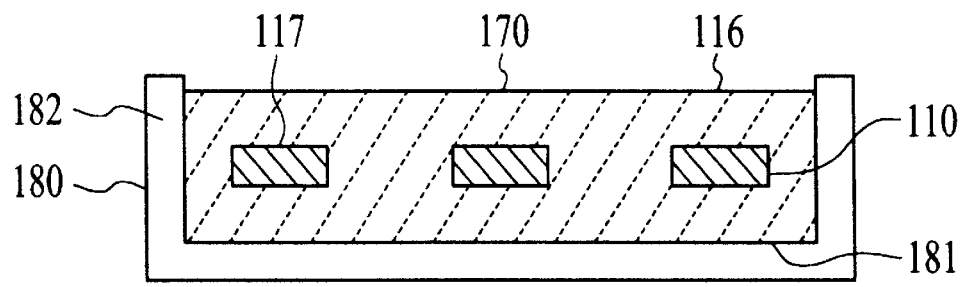
FIGS. 4a through 4d are schematic sectional side views of an electrostatic chuck showing steps in one method of fabricating the electrostatic chuck.
Figure 4B:
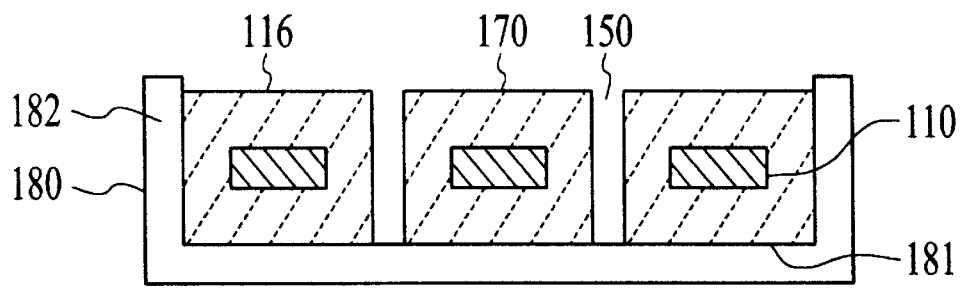

FIGS. 4a through 4b schematically illustrate the steps of fabricating an electrostatic chuck 100 comprising the dielectric insert 200 adapted to reduce plasma glow discharges and arcing about the substrate 55 and FIG. 5 illustrates the steps in a flow chart format. Generally, the steps comprise forming a preform dielectric 116 about an electrode 110, forming an at least partially sintered dielectric insert 200, placing the dielectric insert 200 in the preform 116, and heating the preform 116 to form the dielectric 115, as for example, illustrated in FIG. 5.

The first step involves fabricating a dielectric preform 116 which is later sintered to form the dielectric 115. The dielectric preform 116 may be formed about the electrode 110, as shown in FIG. 4a. In one version, the dielectric preform 116 may cover substantially the entire top surface 117 of the electrode 110. The dielectric preform 116 may also be formed to surround the electrode 110. The dielectric preform 116 may be made from a material that is molded into a preform shape. The dielectric preform 116 may comprise suitable powdered ceramic materials such as, for example, one or more of aluminum nitride, aluminum oxide and silicon dioxide mixed with a small amount of organic binder.

In one version, the dielectric preform 116 may be formed in a mold 180. The mold 180 may be used to form the preform 116 into the desired shape. The desired shape may be obtained by placing the powdered ceramic in the mold 180 and pressurizing the mold to render the powdered ceramic into a preform shape that conforms to the shape of the mold. For example, a dielectric preform 116 comprising a disc shape may be formed by a mold 180 comprising a circular base 181 with sidewalls 182 extending above the base 181 and substantially perpendicular to the base 181. The sidewalls 182 may extend high enough to hold an amount of the preform material to provide the desired thickness of the dielectric preform 116. The mold 180 may be desirably fabricated from materials which can withstand the temperatures and pressures required in the fabrication of the electrostatic chuck 100.

The dielectric preform 116 is shaped to form gas conduits 150 therein, as illustrated in FIG. 4b, for transporting the heat transfer gas. The gas conduits 150 comprise a substantially tubular shape that is sized sufficiently large to contain the dielectric inserts 200 in the region of the gas outlet 204 leading to the surface 170 of the electrostatic chuck 110. The gas conduits 150 may be formed in the dielectric preform 116 by, for example, drilling through the dielectric preform 116.

Figure 6A:
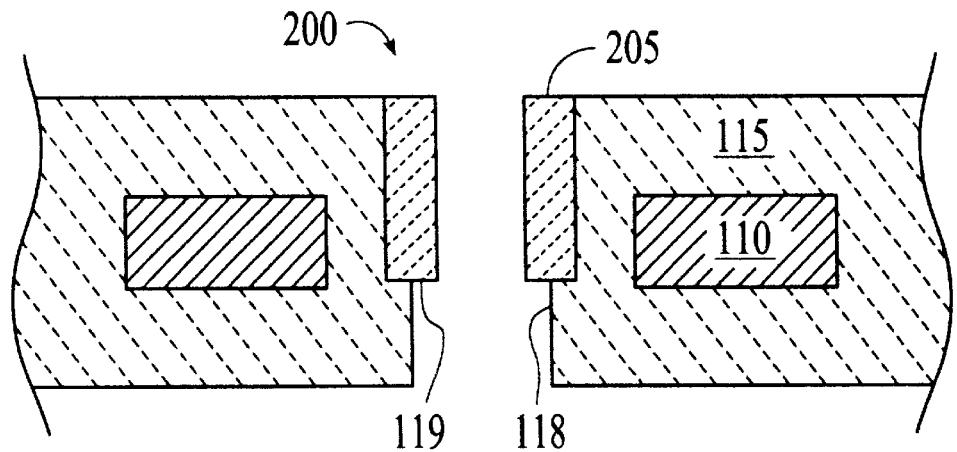
FIG. 6a is a schematic sectional side view of an electrostatic chuck comprising a dielectric insert.

The gas conduits 150 may be formed to hold partially sintered dielectric inserts 200, as illustrated in FIGS. 6a,b and c. For example, a conduit 150 may be formed in the dielectric preform 116 or drilled in the electrode 110 to form an annular ledge 118, the upper surface 119 of which may hold the dielectric insert 200. In one version, ledge 118 may be positioned in the conduit 150 such that the length corresponding to the distance from the ledge 118 to the top surface 170 of the dielectric preform 116 is sized to accommodate a predetermined portion of the dielectric insert 200. For example, the ledge 118 may be positioned so that the entire dielectric insert 200 may be fit within the conduit 150. Alternatively, the ledge 118 may be placed such that the upper surface 119 of the ledge 118 is flush with the top surface 170 of the dielectric preform 116. The ledge 118 may also extend into the conduit 150 a distance corresponding to the width of the upper surface 119 of the ledge 118 desired to hold the dielectric insert 200. The extent to which the ledge 118 extends into the conduit 150 may also be chosen to control the flow of heat transfer gas through the conduit 150.

The dielectric insert 200 is partially sintered to form the desired size and shape. For example, the dielectric insert 200 may be sized to extend substantially through the length of the conduit 150. The dielectric insert 200 may also be at least partially sintered to retain its position and shape within the conduit 150 during fabrication of the electrostatic chuck 100. For example, the dielectric insert 200 may be at least partially sintered to provide a relatively solid structure that will retain its shape upon heating to the same temperature as the sintering temperature. A partially sintered dielectric insert 200 may also withstand pressure applied to the dielectric preform 116 without bending or breaking. The at least partially sintered dielectric insert 200 may be formed by placing a mixture of a ceramic powder comprising, for example, one or more of aluminum nitride, aluminum oxide and silicon dioxide and an organic binder in a mold and heating the mixture to a temperature of at least about 500° C.

Figure 4C:
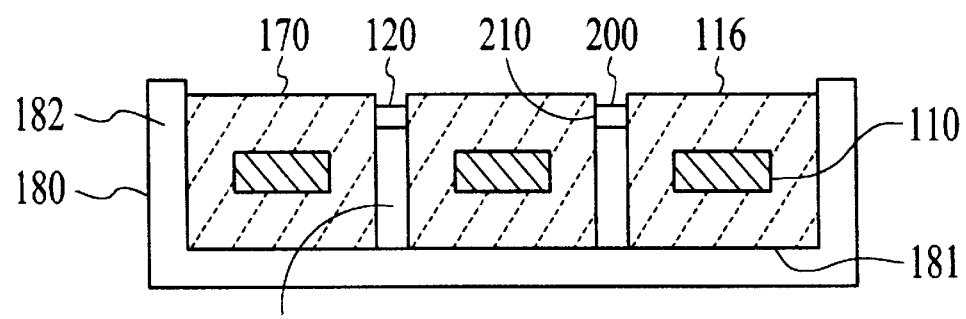

FIG. 4c illustrates placing the dielectric insert 200 in the conduit 150 formed in the dielectric preform 116. The dielectric insert 200 may be placed in the conduit 150 so that the top surface 120 of the dielectric insert 200 is flush with the top surface 170 of the dielectric preform 116. Alternatively, the top surface 120 of the dielectric insert 200 may extend above the top surface 117 of the dielectric preform 116. In one version, the dielectric insert 200 may be placed in the conduit 150 such that the dielectric insert 200 is supported by the ledge 118. Additionally, a binder 210, such as a glass or ceramic powder binder, may be applied to the walls of the conduit 150 abutting the dielectric insert 200 to secure the dielectric insert 200 in place.

In one version, the dielectric preform 116 may be further molded about the dielectric insert 200 once the dielectric insert 200 is in place in the dielectric preform 116. For example, the dielectric preform 116 may be formed about the dielectric insert 200 in such a way as to leave the top of the dielectric insert 200, and hence the conduit 150, exposed (shown). Alternatively, the dielectric preform 116 may be formed to cover the top surface 120 of the dielectric insert 200 (not shown).

The dielectric inserts 200 may be of different types. In one version, as illustrated in FIG. 6a, the dielectric insert 200 comprises an insert 205 comprising at least one continuous hole or passageway that may allow heat transfer or other gas to flow through the conduit 150. The dimensions of the hole are selected to reduce plasma formation, and desirably comprise a diameter equal to or less than about 0.4 mm. The dielectric insert 205 may be fabricated from electrical insulator or dielectric material, plasma-deactivating material, or mixtures thereof. Desirably, the dielectric insert 205 is fabricated from one or more of aluminum oxide, aluminum nitride and silicon dioxide. The holes or passageways are formed in the insert 205 by laser micro-machining, a grinding wheel, or diamond/cubic boron nitride drilling.

Figure 6B:
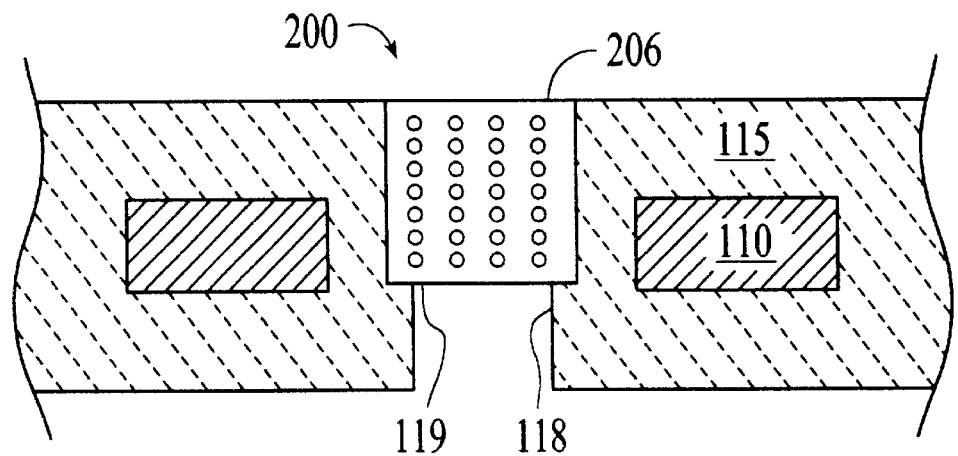
FIG. 6b is a schematic sectional side view of an electrostatic chuck comprising another version of a dielectric insert.

In another version, the dielectric insert 200 comprises a porous material 206, as illustrated in FIG. 6b. The porous material 206 is fabricated such that the material 206 substantially fills up the outlet 204 of the gas conduit 150 when placed in the conduit 150. The material 206 comprises continuous pathways such as interconnected pore passageways, microcracks, and separated grain boundary regions that extend through the entire material 206, providing a passageway for gas through the conduit 150. The continuous passageways may be formed by the intersection of one or more pores, microcracks, and separated grain boundary regions in the porous material 206 allow heat transfer gas to flow therethrough, while reducing or preventing limiting plasma formation in the conduit 150. The porous material 206 may be fabricated from electrical insulator or dielectric material, plasma-deactivating material, or mixtures thereof. In one version, the porous material comprises aluminum nitride.

Figure 6C:
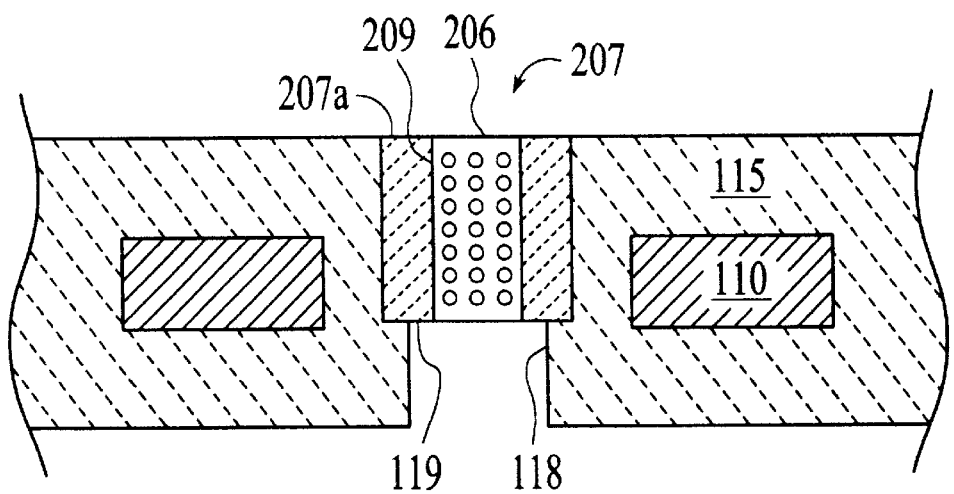
FIG. 6c is a schematic sectional side view of an electrostatic chuck comprising yet another version of a dielectric insert.

In yet another version, the dielectric insert 200 comprises an insert 207 comprising a tubular dielectric sleeve 207a surrounding the porous material 206, as illustrated in FIG. 6c. In one version, the material 206 may be adhered to the sleeve 207a before the insert 207 is placed in the conduit 150. Alternatively, the sleeve 207a may be placed in the conduit prior to inserting the material 206 into the sleeve 207a. Desirably, the material 206 is held in place within the sleeve 207a by a binder 209 comprising a glass or ceramic powder, such as aluminum nitride, which adheres the material 206 to the sleeve 207a, for example, when heated to a softening or melting temperature. This reduces formation of voids between dielectric sleeve 207a and the walls of the conduit which can cause flaws in the dielectric 116 (not shown). By adjusting the size of the porous material 206, the gas flow rate through dielectric insert 207 may be adjusted.

Optionally, a binder material 210, 209 may be applied to surfaces of the conduit 150 or dielectric insert 200, that, upon sintering, adheres the dielectric insert 200 within the conduit 150. In the version using an annular sleeve 207a surrounding a porous material 207b, the binder 209 may be applied between the sleeve 207a and material 207b to bond them together during heating of the dielectric preform 116.

Figure 4D:
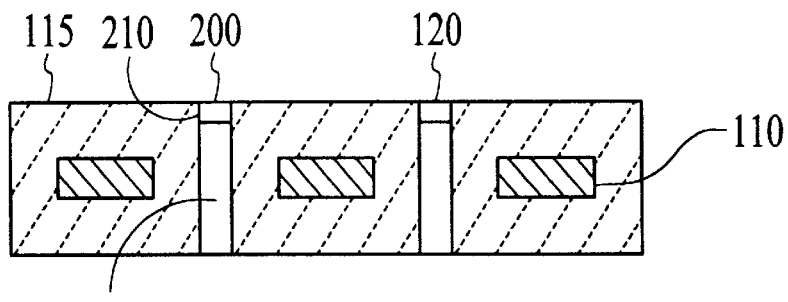

After the dielectric preform 116 with the at least partially sintered dielectric 200 is formed, the dielectric preform 116 is sintered to form the fabricated electrostatic chuck 100, as illustrated in FIG. 4d. The dielectric preform 116 may be heated to a temperature of at least about 1000° C., and even at least about 1500° C., and even at least about 1800° C. In the version where the dielectric preform 116 is in a mold 180, pressure may be applied to the dielectric preform 116 while it is being heated in order to obtain a predetermined shape of the dielectric 115. As the organic binder in the dielectric preform 116 evaporates during heating, the volume of the dielectric preform 116 may shrink. This may cause the position of features, such as conduits 150 formed in the dielectric preform 115 to change position as the dielectric preform 115 is heated. Pressure applied to the surface of the dielectric preform 116 may force the dielectric preform 116 to fill spaces which may appear between the dielectric preform and the side walls 181 of the mold 180 or between the dielectric preform 116 and the dielectric inserts 200 as the organic binder evaporates. Pressure may be applied by, for example, a platen press, an autoclave, or an isostatic press.

One advantage of the present method is that the conduits 150 extending through the dielectric 115 may be formed in the dielectric preform 116 before sintering. Thus, the steps of drilling or machining of the dielectric 116 after sintering or when the dielectric 116 is relatively hard, are not necessary. However, once the dielectric 115 is sintered, it may be drilled or machined as desired to form other conduits or features. For example, in the version where the dielectric preform 116 may be applied to cover the top surface 120 of the dielectric insert 200, the dielectric 115 may be machined or ablated to re-expose the top surface 120.

Although the present invention has been described with regard to the desired versions thereof, other versions are possible. For example, the dielectric insert 200 may be fabricated in other shapes and forms equivalent to the illustrative structures herein. Furthermore, the terms below, above, bottom, top, up, down, first and second and other relative or positional terms are shown with respect to the exemplary embodiments in the Figures and are interchangeable. Therefore, the appended claims should not be limited to the description of the desired versions contained herein.

What is claimed is:

1. A method of fabricating an electrostatic chuck capable of holding a substrate in a chamber, the method comprising:
    (a) forming an at least partially sintered dielectric insert;
    (b) forming a dielectric preform comprising an electrode and a gas conduit, and placing the dielectric insert in the gas conduit of the dielectric preform; and
    (c) after (b) sintering the dielectric preform and the dielectric insert.

2. The method of claim 1 wherein the dielectric insert is at least partially sintered at a temperature of at least about 500° C.

3. The method of claim 1 wherein (c) comprises applying a pressure to the dielectric preform.

4. The method of claim 1 wherein the dielectric insert comprises pores that may serve as gas passageways for the passage of a gas therethrough.

5. The method of claim 4 wherein (b) comprises placing a sleeve about the dielectric insert in the conduit.

6. The method of claim 5 wherein the sleeve comprises a substantially non-porous material.

7. The method of claim 1 wherein (c) comprises sintering the dielectric preform and dielectric insert at a temperature of at least about 1000° C.

8. The method of claim 1 wherein the dielectric insert comprises one or more of aluminum nitride, aluminum oxide and silicon dioxide.

9. The method of claim 1 wherein the dielectric preform comprises one or more of aluminum nitride, aluminum oxide, and silicon dioxide.

10. A method of fabricating an electrostatic chuck capable of holding a substrate in a chamber, the method comprising:
    (a) forming an at least partially sintered dielectric insert;
    (b) forming an unsintered dielectric preform comprising an electrode and a gas coiiduit and placing the dielectric insert in the gas conduit of the unsintered dielectric preform; and
    (c) simultaneously sintering the dielectric preform and the dielectric insert.

11. The method of claim 10 wherein the dielectric insert is at least partially sintered at a temperature of at least about 500° C.

12. The method of claim 10 wherein (n) comprises applying a pressure to the dielectric preform.

13. The method of claim 10 wherein the dielectric insert comprises pores that may serve as gas passageways for the passage of a gas therethrough.

14. The method of claim 13 wherein (b) comprises placing a sleeve about the dielectric insert in the conduit.

15. The method of claim 14 wherein the sleeve comprises a substantially non-porous material.

16. The method of claim 10 wherein (c) comprises sintering the dielectric preferm and dielectric insert at a temperature of at least about 1000° C.

17. The method of claim 10 wherein the dielectric preform and dielectric insert comprise one or more of aluminum nitride, aluminum oxide, and silicon dioxide.

18. A method of fabricating an electrostatic chuck capable of holding a substrate in a chamber, the method comprising:
    (a) at least partially sintering a dielectric insert at a temperature of at least about 500°C;
    (b) forming an unsintered dielectric preform comprising an electrode and a gas conduit, and placing the dielectric insert in the gas conduit of the unsintered dielectric preform; and
    (c) simultaneously sintering the dielectric preform and the dielectric insert at a temperature of at least about 1000° C. while applying a pressure to the dielectric preform.

19. The method of claim 18 wherein the dielectric insert comprises pores that may serve as gas passageways for the passage of a gas therethrough.

20. The method of claim 18 wherein (b) comprises placing a sleeve about the dielectric insert in the conduit.

* * * * *